(12) United States Patent
Morén

(10) Patent No.: US 6,281,842 B1
(45) Date of Patent: Aug. 28, 2001

(54) CONDUCTIVE CIRCUIT DEVICE AND METHOD

(75) Inventor: Stefan Morén, Kista (SE)

(73) Assignee: Allgon AB, Akersberga (SE)

( * ) Notice: Subject to any disclaimer, the term of this patent is extended or adjusted under 35 U.S.C. 154(b) by 0 days.

(21) Appl. No.: 09/249,776

(22) Filed: Feb. 16, 1999

(51) Int. Cl.⁷ .................................................. H01Q 1/48
(52) U.S. Cl. .................... 343/700 MS; 343/895; 29/600; 428/42.3
(58) Field of Search ................... 343/700 MS, 895; 29/592.1, 601, 33 G; 428/600, 901, 42.3; 221/9, 76; 242/535, 535.3

(56) References Cited

U.S. PATENT DOCUMENTS

| | | | |
|---|---|---|---|
| 3,963,456 | * 6/1976 | Tsuchiya et al. | 29/203 B |
| 4,356,492 | * 10/1982 | Kaloi | 343/700 MS |
| 4,843,404 | 6/1989 | Benge et al. | 343/895 |
| 4,846,922 | 7/1989 | Benge et al. | 156/324 |
| 5,113,921 | * 5/1992 | Pool | 156/71 |
| 5,277,734 | 1/1994 | Bayer | 156/230 |
| 5,291,180 | 3/1994 | Reeb | 340/572 |
| 5,456,001 | * 10/1995 | Mori et al. | 29/739 |
| 5,520,766 | * 5/1996 | Iwasaki | 428/42.3 |
| 5,592,150 | * 1/1997 | D'Hont | 343/895 |
| 5,989,377 | * 11/1999 | Wilheim et al. | 428/901 |
| 6,052,889 | * 4/2000 | Yu et al. | 29/600 |

FOREIGN PATENT DOCUMENTS

| | | |
|---|---|---|
| 19837689A1 | 8/1998 | (DE) . |
| 88/08592 | 4/1988 | (WO) . |
| 97/15093 | 10/1996 | (WO) . |

\* cited by examiner

*Primary Examiner*—Don Wong
*Assistant Examiner*—Thuy Vinh Tran
(74) *Attorney, Agent, or Firm*—Jacobson Holman, PLLC

(57) ABSTRACT

The present invention facilitates the manufacturing of devices comprising printed circuits on flexible substrates. The objects of the invention are obtained by a device for feeding items to a manufacturing machine, where the device comprises a long flexible film arranged in a roll, and the film comprising a first protective layer for carrying each of the items. An adhesive agent, applied between the item and the protective layer, attaching the item to the protective layer. The first protective layer and the agent cooperating so that when the item is detached from the first protective layer substantially all of the adhesive agent is disposed on the item and where the item comprises a printed circuit.

14 Claims, 6 Drawing Sheets

5a

5b

5c

5d

6a

6b

CONDUCTIVE CIRCUIT DEVICE AND METHOD

TECHNICAL FIELD OF INVENTION

The present invention relates to a production method for, and a device for facilitating the production of, printed circuits for radio communication equipment. In general, and more particular to a production method for, and a device for facilitating production of, printed circuits disposed on a flexible carrier.

DESCRIPTION OF RELATED ART

The rapid expansion in the mobile telecommunication market and specifically in the radio communication market has led to a tremendous increase in the demand for radio communication devices. Thus the production of such devices increases. For a player on this market to stay competitive it is vital to have competitive products and a smooth manufacturing process for these products.

A specific, important, such product, in the radio communication area, is the antenna device. It is important for the antenna device to adhere to strict requirements of radio frequency characteristics, for instance electric length etc., in the particular radio frequency bands in which it is designed to be operative. These requirements in turn set requirements for the manufacturing process of these devices. For antenna devices designed with a conductive wire formed as a helix. The production might result in devices which vary somewhat in the aforementioned characteristics. These devices are, however, robust, low-cost and has proven to be, once tested to adhere to said requirements, a successful approach in the design of antenna devices for radio communication devices.

An antenna device designed as a conductive pattern on a flexible substrate has proven to be a design with very stable radio frequency characteristics. This is dependent on the accuracy with which it is possible to design the pattern on the flexible substrate. There is also a number of other advantages with using a flexible substrate. It can however be a problem to handle these thin flexible items in the manufacturing process. These problems might include that the items adhere to each other, that they hook in to slits in each other, difficulties in applying them to a coil neck (e.g. the antenna support), that they get stuck in fissures in the manufacturing machines etc. it would therefore be beneficial to have a manufacturing process to use the advantageous flexible substrates which do not have the above mentioned problems in the manufacturing.

SUMMARY OF INVENTION

One object of the present invention is thus to achieve a device for facilitating the manufacturing of devices comprising printed circuits on flexible substrates. This object is obtained by a device for feeding items to a manufacturing machine, where the device comprises a long flexible film arranged in a roll, the film comprising a first protective layer for carrying each of the items. An adhesive agent, applied between said item and the protective layer, attaching the item to the protective layer, the first protective layer and the agent cooperating so that when the item is detached from the first protective layer substantially all of the adhesive agent is disposed on said item and where the item comprises a printed circuit.

Another object of the present invention is to provide a method for manufacturing of a device which facilitate the manufacturing of devices comprising printed circuits on flexible substrates. This object is obtained by providing a method for manufacturing a roll of printed circuit diagrams wherein a long flexible first carrier having a conductive substrate and being arranged in a roll, is screen printed according to a first pattern with a screen paint; the part of the conductive substrate, not covered by the screen print, is etched away so that a printed circuit is obtained; the screen paint is washed away; a long flexible second carrier, comprising on a first side an adhesive agent, is laminated together with the first carrier, with the first side facing the first carrier; a first form is punched on the first carrier; excess material of the first carrier is removed so that a band is formed with the first carrier carrying items comprising said printed circuit having the first form.

Another object of the present invention is to provide a method for manufacturing an antenna device comprising at least one printed circuit on a flexible substrate, where said printed circuit comprises at least one radiating element.

An advantage with the present invention is that a smooth and efficient manufacturing process is achieved for the production of printed circuits on a flexible substrate.

An advantage, according to one embodiment of the invention, is that the above mentioned problems are avoided.

An advantage, according to one embodiment of the invention, is that each printed circuit item is well protected from damage and is fed in a controlled manner to a mounting machine.

An advantage, according to one embodiment of the invention, is that the orientation of the printed circuit items can be chosen to fit the specific application or mounting machine.

An advantage, according to one embodiment of the invention, is that it is easy to produce several different printed circuit layouts in one batch.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF PREFERRED EMBODIMENTS

Figure 1:
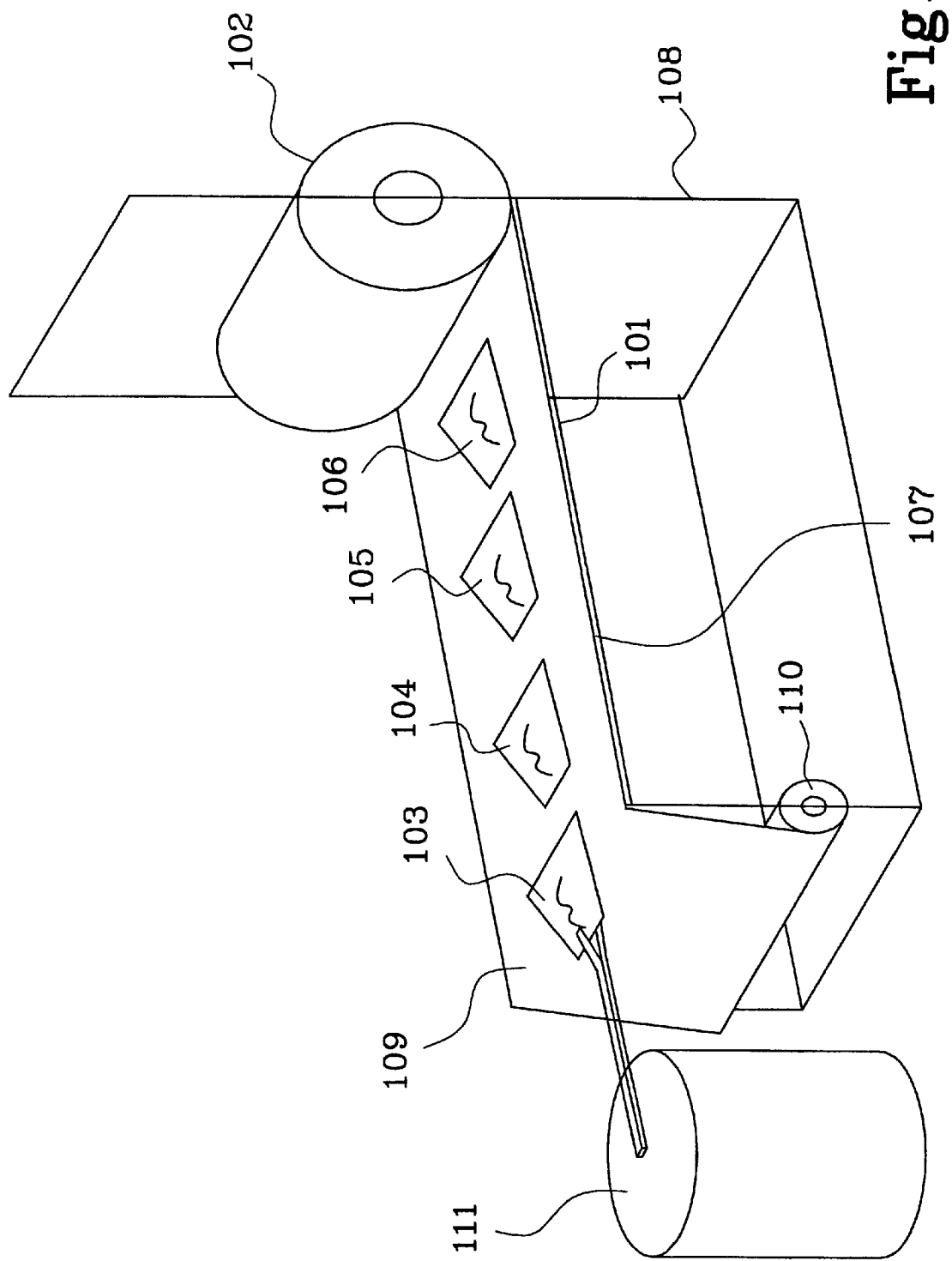
FIG. 1 shows a perspective view of a roll according to a preferred embodiment of the present invention.

FIG. 1 shows a long flexible film 101 arranged in a roll 102. The film 101 comprises antenna elements, whereof four 103, 104, 105 and 106 are visible, and a protective carrier layer 107. The antenna elements consist of etched printed circuits, having specific radio frequency characteristics, applied on a flexible substrate. Between the antenna elements and the protective layer 107 is an adhesive agent present (not shown). The roll 102 is mounted on a stand 108 according to known methods and the film 101 is fed over an edge 109 to a dispose roll 110 which collect the protective layer 107. When the film 101 is fed over the edge 109 the antenna element 103 detach from the protective layer 107. The film 101 is fed so that a convenient part of the antenna element 103 protrudes out from the edge 109. This enables a mounting machine 111 to easily grab the antenna element 103 for mounting on a antenna support structure (not shown). The mounting machine 111 is depicted in a schematic manner in FIG. 1. Several different arrangement are possible for the mounting machine in dependence of the specific requirements for the specific application.

Figure 2:
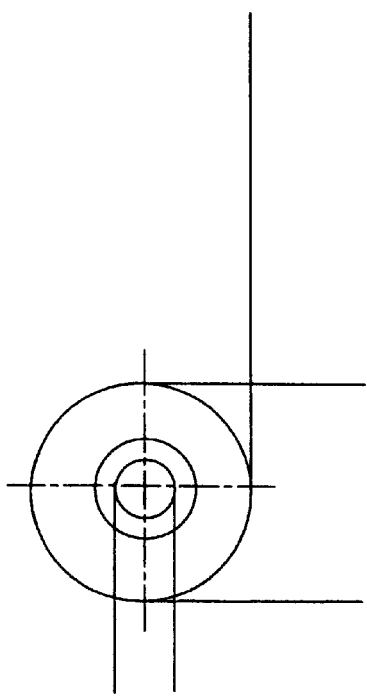
FIG. 2 shows a side view of a roll according to a preferred embodiment of the invention.

FIG. 2 shows the roll 102 comprising antenna elements in a side view.

Figure 3:
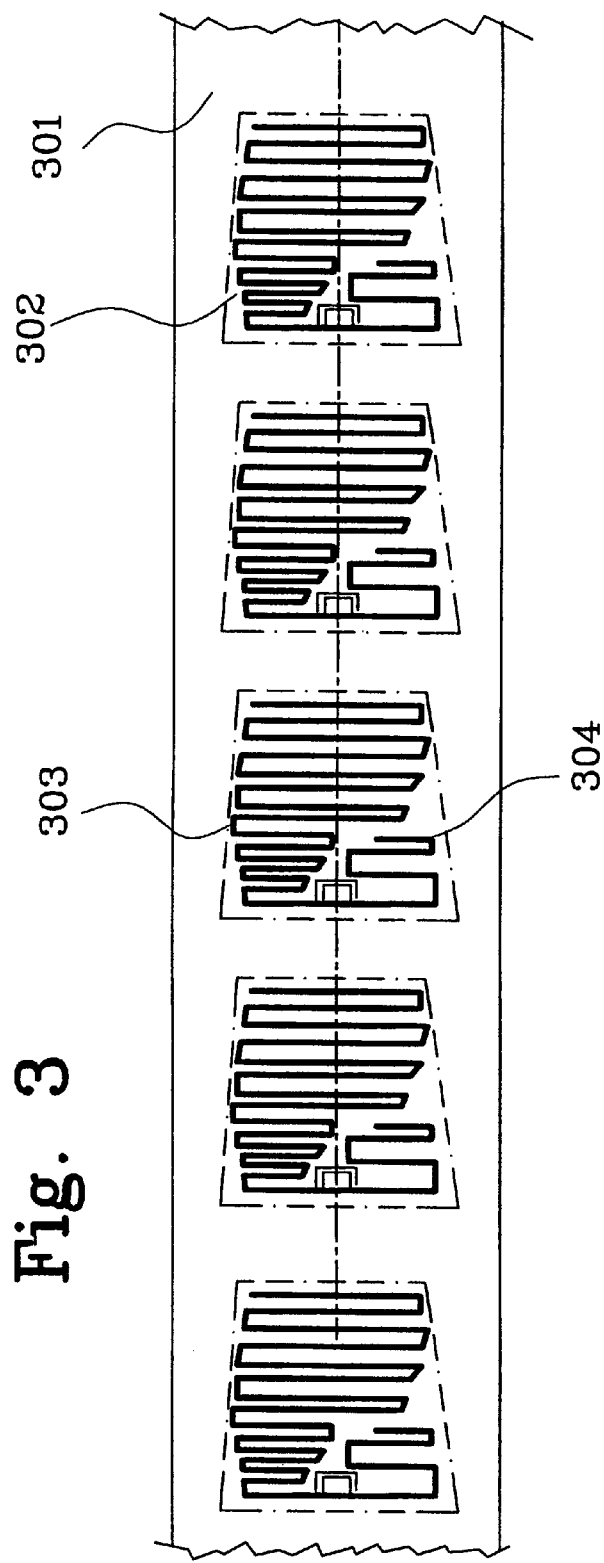
FIG. 3 shows a top view of a long flexible film comprising printed circuit items according to a preferred embodiment of the invention.

FIG. 3 shows a part of a long flexible carrier film 301, which is to be arranged in a roll, comprising antenna elements 302. The antenna elements in this application are dual band elements having a first and second radiating element 303 and 304, respectively. It is of course also possible to include other types of printed circuits than radiating elements such as for instance a matching circuit, etc.

Figure 4:
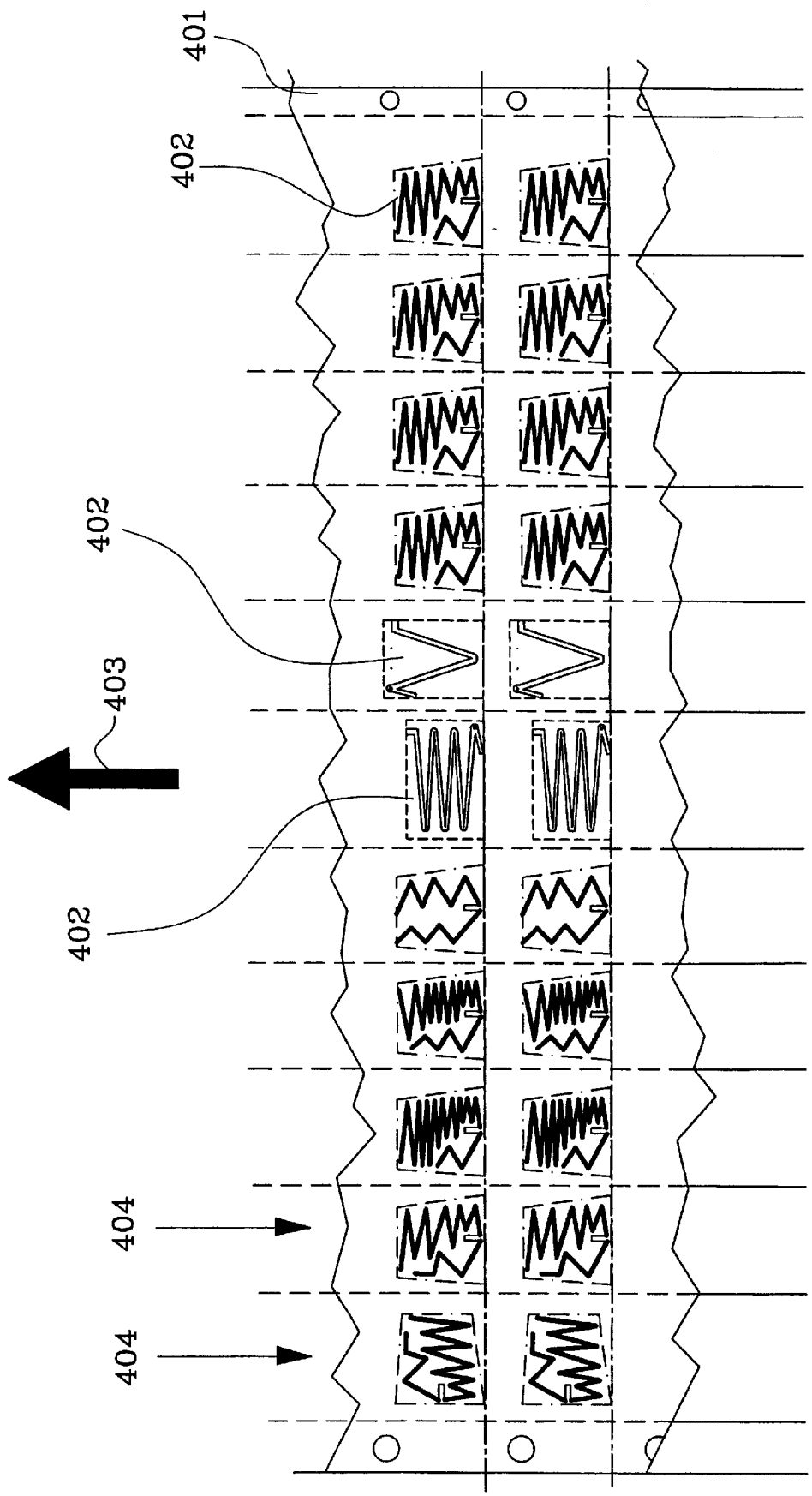
FIG. 4 shows a top view of a long flexible film comprising several parallel printed circuit items according to a preferred embodiment of the invention.

FIG. 4 shows a part of a long flexible carrier layer 401, which is to be arranged in a roll, comprising several parallel antenna elements 402 of different size, with different patterns and arranged in different directions. The arrow 403 indicates the direction of roll out. In the production process it might be beneficial to process and manufacture several rolls of printed circuits simultaneously. The different parallel structures 404 are at a later stage in the production process cut in individual rolls.

Figure 5:
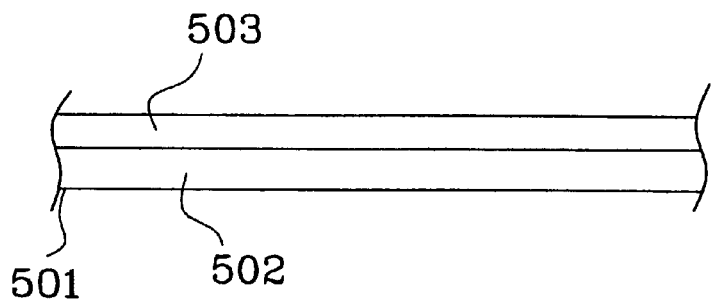
FIGS. 5a, 5b, 5c, 5d and 5e, discloses a long flexible film after different process steps of in a method according to a preferred embodiment of the invention.
Figure 5:
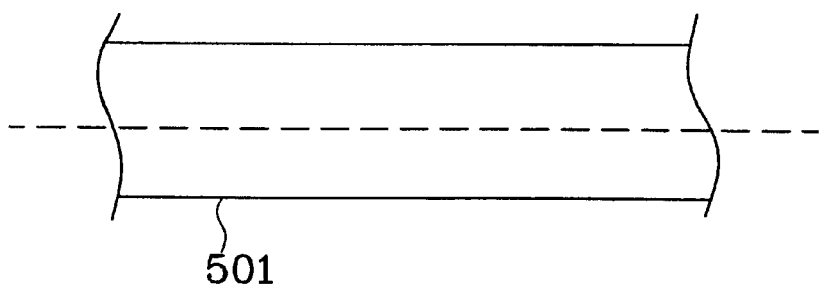
Figure 5:
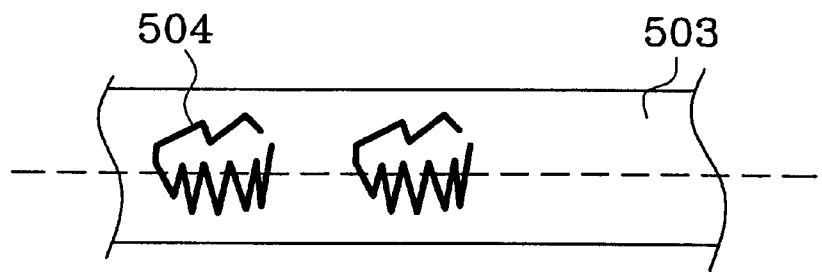
Figure 5:
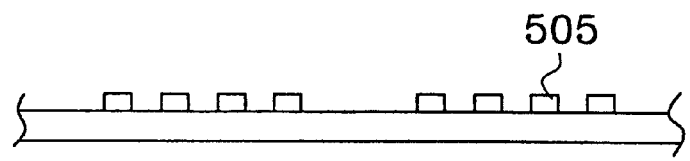
Figure 5:
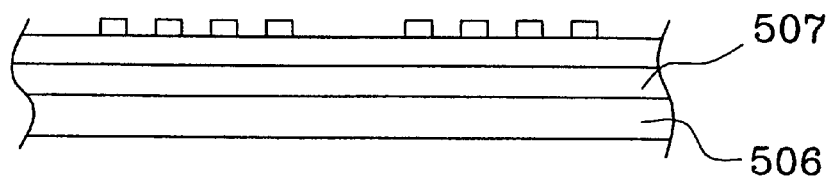
Figure 6:
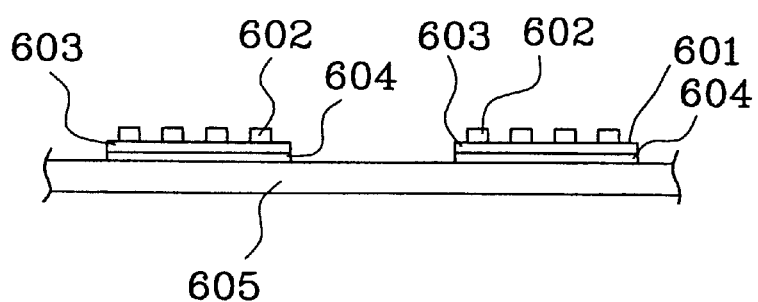
FIGS. 6a, 6b disclose the final long flexible film after all steps in FIG. 5.
Figure 6:
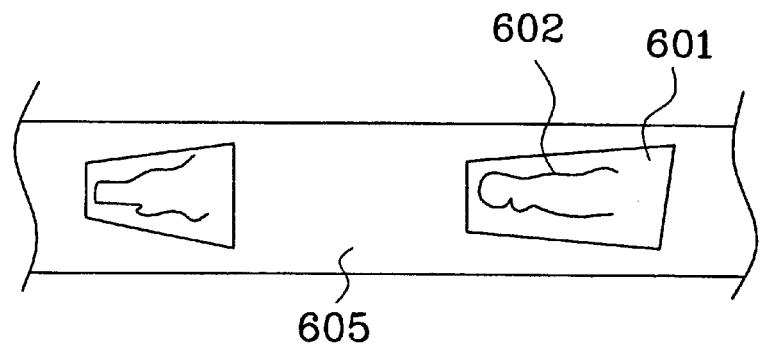

FIGS. 5a–5e show a small part of a long flexible film 501 after different process steps in d method according to a preferred embodiment of the invention. FIG. 5a shows a side view, and FIG. 5b shows a top view, of the long flexible substrate 501 before the first step of the present method. The substrate 510 comprises a first flexible polyester substrate 502 and on top of that a conductive copper layer 503. On the conductive copper layer 503 is a pattern 504 printed, as shown in FIG. 5c, one after the other, along the long flexible substrate 501, with a paint, which is resistant to the etching fluids later used. Of course, as been previously mentioned, several, different or alike, patterns may he printed in parallel to produce several rolls in one batch. For sake of clarity only one is shown in this preferred embodiment. The substrate 501 is next exposed to etching fluids, which etches away excess copper not covered by said paint so that a conductive pattern, a printed circuit 505, is achieved as shown in a side view in FIG. 5d. The paint is washed away and a protective layer 506 having an adhesive agent 507 is laminated with the polyester layer carrying the printed circuit 505 as shown in FIG. 5e to produce the long flexible film. In FIG. 6a, which shows a side view, and 6b which shows a top view, is the final long flexible film disclosed after the form for the printed circuits 601 has been punched out and excess material removed. The printed circuit item consists of a conductive pattern 602, a flexible carrier 603, and an adhesive agent 604. The printed circuit item are attached to the protective layer 605 under the influence of the adhesive agent 604. Thus has a flexible printed circuit been created which is easily detachable as previously discussed.

Figure 7:
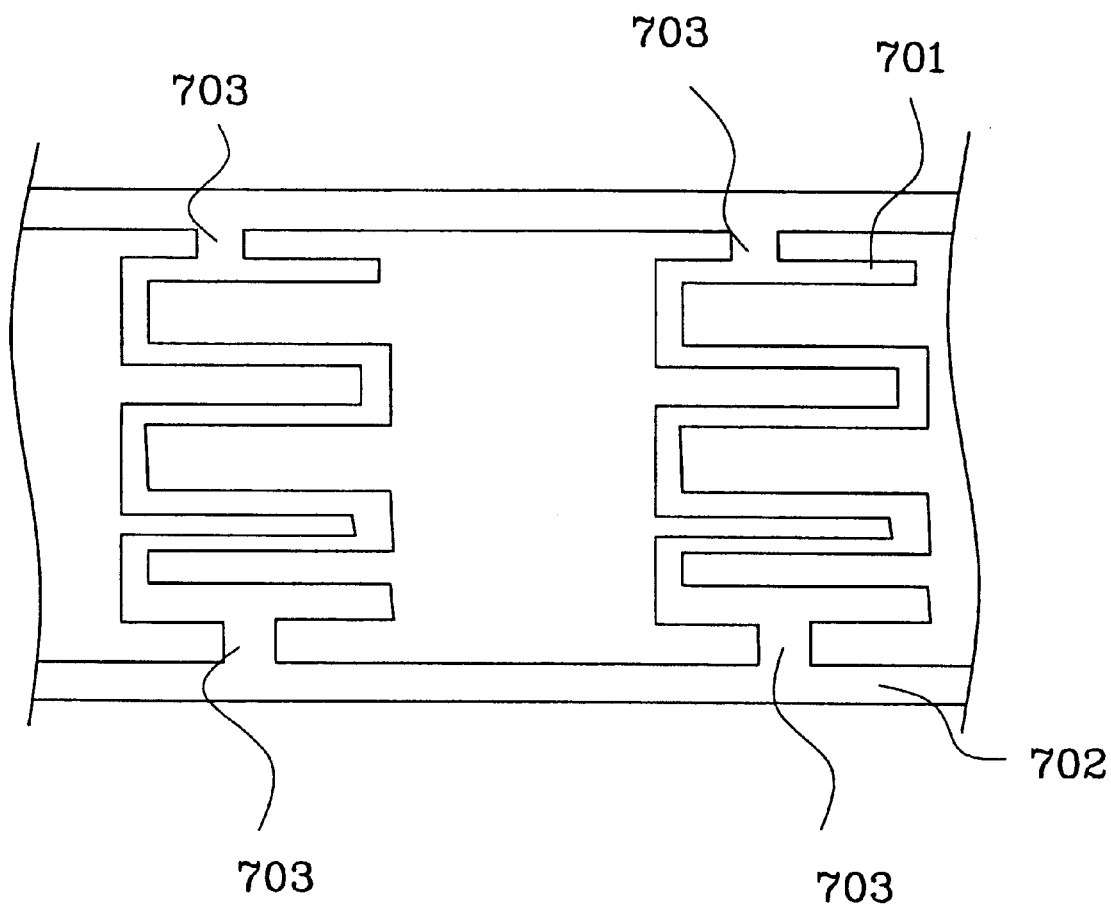
FIG. 7 is another embodiment showing the conductive circuit and carrier formed from the same flexible conductive metallic sheet.

In FIG. 7, is another preferred embodiment according to the invention is disclosed. In this embodiment conductive circuit 701 and a carrier 702 is formed from the same flexible conductive metallic sheet by punching out a predefined pattern. The pattern constitutes a radiating antenna device operative in at least a first frequency band and adapted for being coupled to RF circuitry (not shown). The conductive circuit 701 is hold in place on the carrier 702 through small retainer parts 703. The retainer parts 703 are firm enough to hold the conductive circuit in place but weak enough to indestructibly release the conductive circuit 701 in the manufacturing process. Of course more than two retainer parts be used to hold each conductive circuit 701.

It shall be realized that while a very specific and concrete example has been given the theme may be varied. For instance, a silver-polymer be used as the conductive circuit, other methods for achieving the printed circuit may be used, for instance the printed circuit be printed on the flexible carrier using a conductive paint.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A dispensing device for mechanically feeding items for use in an automatic assembly process, said dispensing device comprising:

a band of flexible composite film arranged in multiple turns forming a roll having essentially a circularly cylindrical shape, said film including a plurality of items to be fed, and a continuous carrier layer for carrying each of said items, and said items having a conductive circuit forming a radiator for transmitting/feeding information-carrying radio signals in an UHF range.

2. The device of claim 1, wherein said items are stickers, and said conductive circuits are disposed on said stickers.

3. The device of claim 1, wherein an adhesive agent, located between said items and said carrier layer, attaching said items to said carrier layer, and said adhesive agent having a greater adhesion to each of said items than to said carrier layer, so as to attach to each of said items as it is separated from said carrier layer.

4. The device of claim 3, wherein said items are arranged to be adhesively attachable to a cylindrical surface.

5. The device of claim 3, wherein said items are arranged to be adhesively attachable to a spheroid surface.

6. The device according to claim 3, wherein said item comprises a flexible substrate, that said adhesive agent is disposed on a first side of said flexible substrate facing a protective layer, and that said first conductive circuit is disposed on a second side of said flexible substrate opposite said first side.

7. The device of claim 1, wherein said conductive circuit is composed of at least one element in a group consisting of: a dried conductive paint, an etched metal plate pattern produced in a positive pattern printing process, an etched metal plate pattern produced in a photo process, a punched metal plate pattern.

8. The device of claim 1, wherein said items further comprising at least one further conductive circuit forming at least one element selected from a group consisting of: a radiator, a parasitic resonator, an inductor, a capacitor, a connector, a marking.

9. The device of claim 8, wherein said at least one further conductive circuit being conductively coupled to said first conductive circuit.

10. The device of claim 8, wherein said at least one further conductive circuit being capacitively coupled to said first conductive circuit.

11. The device of claim 8, wherein said at least one further conductive circuit being inductively coupled to said first conductive circuit.

12. The device according to claim 1, wherein
said first conductive circuit comprises a first contact area arranged for being in electrical contact with RF circuitry in a radio communication device, and
said radiator having radio frequency characteristics so as to be operative in at least a first frequency band.

13. The device according to claim 1, wherein
said first conductive circuit comprises at least a first part having radio frequency characteristics so as to match said radiating member to a predetermined impedance.

14. The dispersing device according to claim 1, wherein
said items are arranged for receiving at least a first discrete component conductively connectable to said first conductive circuit.

* * * * *